United States Patent
Zhou et al.

(10) Patent No.: US 7,886,422 B1
(45) Date of Patent: Feb. 15, 2011

(54) ULTRASONIC RECLAIM METHOD FOR DISK DRIVE SUSPENSIONS

(75) Inventors: Haiming Zhou, Chang An Town (CN); Haijun Gao, Chang An Town (CN); Fei He, DongGuan (CN)

(73) Assignee: Magnecomp Corporation, Murrieta, CA (US)

( * ) Notice: Subject to any disclaimer, the term of this patent is extended or adjusted under 35 U.S.C. 154(b) by 338 days.

(21) Appl. No.: 12/186,026

(22) Filed: Aug. 5, 2008

Related U.S. Application Data

(60) Provisional application No. 61/059,754, filed on Jun. 7, 2008.

(51) Int. Cl.
*G11B 5/127* (2006.01)
*H04R 31/00* (2006.01)

(52) U.S. Cl. .............. 29/603.02; 29/603.03; 29/402.11; 29/402.21; 29/426.1; 29/736; 228/51; 228/175; 228/180.22; 228/219; 228/264; 156/73.3; 156/73.6; 360/234.6; 360/234.7; 360/245.4

(58) Field of Classification Search ................ 29/402.6, 29/402.11, 402.21, 426.1, 736, 762; 228/51; 228/175, 180.22, 219, 264; 156/73.3, 73.6; 360/234.6, 234.7, 245.4
See application file for complete search history.

(56) References Cited

U.S. PATENT DOCUMENTS

| | | | |
|---|---|---|---|
| 5,029,747 A | 7/1991 | Russo et al. | |
| 5,164,037 A | 11/1992 | Iwami et al. | |
| 5,782,403 A | 7/1998 | Wang | |
| 6,059,170 A * | 5/2000 | Jimarez et al. | 228/119 |
| 6,607,117 B1 | 8/2003 | Kang et al. | |
| 6,757,961 B2 | 7/2004 | Wong et al. | |
| 6,829,818 B2 | 12/2004 | Kamigama et al. | |
| 6,971,155 B2 * | 12/2005 | Nakagawa | 29/603.06 |
| 7,013,554 B2 | 3/2006 | Wong et al. | |
| 7,296,335 B1 | 11/2007 | Thaveeprungsriporn et al. | |
| 7,342,749 B2 * | 3/2008 | Hashi et al. | 360/245.8 |
| 7,621,033 B2 * | 11/2009 | Rochford et al. | 29/426.1 |
| 2006/0037188 A1 | 2/2006 | Fukaya et al. | |

OTHER PUBLICATIONS

Lalonde, Suspension Reclaim Process Utilizing Laser Processing, Mar. 2007, Research Disclosure Database No. 515026, Kenneth Mason Publications Ltd, Hants, UK.

\* cited by examiner

*Primary Examiner*—Paul D Kim
(74) *Attorney, Agent, or Firm*—Intellectual Property Law Office of Joel D. Voelzke

(57) ABSTRACT

A method is provided for reclaiming a suspension from a disk drive head gimbal assembly (HGA). An ultrasonic probe is applied to the HGA's read/write head slider on a side opposite that of its solder balls. Ultrasonic oscillations are transmitted through the ceramic slider to the side with the solder balls. The oscillations break the brittle intermetallic compound of the slider balls and free the slider. The ultrasonic energy also weakens the epoxy adhesive between the slider and suspension. The method can be used with heat to further weaken the solder balls and adhesive.

15 Claims, 2 Drawing Sheets

ULTRASONIC RECLAIM METHOD FOR DISK DRIVE SUSPENSIONS

CROSS-REFERENCE TO RELATED APPLICATIONS

This application claims priority from U.S. provisional patent application No. 61/059,754 filed Jun. 7, 2008.

BACKGROUND OF THE INVENTION

1. Field of the Invention

This invention relates to the field of disk drives, in particular to reclaiming disk drive head gimbal assemblies.

2. Description of Related Art

A disk drive generally uses one or more spinning storage disks, sometimes called storage media, to store data. Disks can be rigid, as used in hard drives, or flexible, as used in floppy drives. Disks commonly store data using magnetic methods or optical methods, and can spin at rates exceeding 15,000 revolutions per minute (rpm). Hard disk drives generally employ several rigid disks stacked one on top of another with spaces in between, attached to a common spindle. Floppy disk drives generally employ a single flexible disk in a bonded sleeve.

Over the surface of each disk in a disk drive, commonly on both sides of each disk, a read-write head is suspended in close proximity to the disk surface by a disk drive suspension. A disk drive suspension is sometimes referred to as a disk drive head suspension or simply a suspension. In hard disk drives with multiple disks on a spindle, suspensions operate in the spaces between the disks and on the two outer disk surfaces. A suspension is a cantilever beam-like feature, mounted on a movable actuator arm. The suspension extends to a precise but variable location above a disk. A suspension typically includes a mounting region, a hinge, load beam, gimbal, and flexure.

The combination of a suspension as discussed above and a read-write head is sometimes called a suspension assembly or a head gimbal assembly (HGA).

The load beam is a major arm-like part of the suspension which forms part of its structural backbone. An actuator arm supports the load beam at the load beam's proximal end, and the load beam supports the flexure at the load beams' distal end. The term "load beam" refers to a structure which may be unitary or may be composed of separately formed parts which are later affixed to one another.

The gimbal is held by the load beam over the disk. The gimbal retains the read-write head in a precise position near the load beam distal end while allowing the read-write head to pitch and roll slightly. A gimbal can be an integrally formed portion of a load beam, or it can be a separately formed part.

The flexure is typically referred to as a wiring layer or a circuit or one of several branded terms, i.e. Integrated Lead Suspension (ILS), Flex On Suspension (FOS), Integrated Lead Flexure (ILF), Electrical Lead Suspension (ELS), or Additive Circuit Gimbal (ACG). The flexure electrically connects the read-write head, located at the distal end of the suspension, to disk drive circuits at the proximal end of the head suspension. An electrical interconnect, sometimes referred to as "electrical leads," is supported by the flexure and is often integrally formed with the flexure. The electrical interconnect carries electrical signals from the read-write head that are read from the disk across the suspension to disk drive circuitry. The flexure also carries electrical signals to be written to the disk from the disk drive circuitry across the suspension to the read-write head. The flexure can be integrally formed on a load beam.

The read-write head, also referred to as a head or a "slider," contains read-write transducer circuitry upon its proximal end. The slider surface facing the disk is designed and reactive-ion etched to define an aerodynamic pattern typically comprising rails that, in conjunction with the spinning disk, generate a positive pressure thereby lifting the slider from the spinning disk surface. The wind of the rapidly spinning disk running past an aerodynamic pattern of protrusions on the slider creates the air bearing surface (ABS) that enables the slider to fly at a constant height close to the disk during operation of the disk drive. The resultant boundary layer of air is commonly called an air bearing. The gram force of the load beam hinge pushes the slider toward the disk while the air bearing of the disk pushes away until an equilibrium position is reached. The equilibrium position is designed to be close enough to the disk so that the slider's read-write circuitry can interact with the disk but far enough away to prevent mechanical contact.

The slider is commonly a magnetic head which is typically formed from a wafer compound of a multi-layer substrate. The slider is attached onto a tongue area of the suspension, typically using a small amount of epoxy between the slider and suspension tongue. Solder balls or gold balls are then bonded between the slider pads and the suspension pads. These solder or gold balls, sometimes called "bonding balls," transfer electrical signals between the suspension and the slider.

The manufacturing process of assembling HGAs by adhering a slider to a disk drive head suspension, or "suspension" for shorthand, and soldering their electrical contacts with solder or gold balls is well known in the art. After assembly, testing can indicate a problem with the slider or read/write head on the slider. If testing reveals a problem with the slider, either because of a defect or electrostatic discharge (ESD) damage to the slider, the defective slider can be removed and the suspension reused. The process of removing a defective slider from a suspension is sometimes called a "suspension reclaim method" or "reworking a head gimbal assembly."

A common prior art suspension reclaim method is to use a cutter to cut the gold balls or solder balls which electrically connect the slider and suspension electrical trace pads. This is sometimes called a "cutting method." This method is labor intensive and the reclaim yield is not high. For gold balls, the results of this method can be adequate; however, for solder balls, this method has been found to have serious deficiencies.

Solder balls are often smaller than their gold ball counterparts and so are more difficult to work with. Additionally, solder balls are fully connected with the bonding pads and there is a layer of relatively hard intermetallic compound (IMC), generally consisting of $AuSn_2$ and $AuSn_4$, between the solder balls and metal terminal pads. Thus, it can be very difficult to remove solder balls by the cutting method. Because the IMC layer is very hard and the solder balls fully contact the slider pads and suspension pads, cracks sometimes develop in flexure terminal pads after removing solder balls and sliders from suspensions.

U.S. Pat. No. 7,296,335 to Thaveeprungsriporn et al. and assigned to the assignee of the present invention discloses a prior art suspension reclaim method which uses ultrasonic energy. Ultrasonic energy, or oscillations, can weaken bonding balls. In Thaveeprungsriporn, an ultrasonic probe is placed in contact with or near to the connection (i.e. bonding balls) between the slider and the gimbal and the slider is separated from the suspension. However, due to the extremely delicate nature of the connections and labor-intensive use of an ultrasound machine, an improved method of using ultrasonic energy is sought.

SUMMARY OF THE INVENTION

An ultrasonic suspension reclaim method is presented in which ultrasonic waves are applied onto a side of the slider opposite the solder balls. A frequency of 28 kHz, an ultrasonic tip overlap of 0.1 mm, and a solder ball temperature of 190° C. have been found to also improve the way ultrasonic energy can be used to reclaim a disk drive suspension.

The inventors have found that ultrasonic energy applied on the side of the slider opposite the solder balls is quite effective at removing the solder balls. If an ultrasonic probe is placed in direct contact with the bonding balls as in Thaveeprungsriporn et al., the intrinsically uneven outer profile of the solder balls allows the tip of the probe to directly contact only one or two solder balls at a time, perhaps more if the tip is pushed hard enough. Thus, one or two solder balls experience direct, unattenuated ultrasonic energy while the other (four) solder balls experience attenuated ultrasonic energy. Furthermore, if the metal probe tip is positioned slightly away from the bonding balls so that it contacts the bonding balls on each forward stroke and leaps away from their surfaces on each back stroke, the result is a "knocking" against the solder balls. This knocking can be accidental or the result of a purposeful technique, as taught in FIGS. 3A-3D of Thaveeprungsriporn et al. In either case, the exposed solder balls experience direct blows by the metal tip instead of smooth, sinusoidal vibrations.

In the present invention, the ultrasonic tip is applied to the side of the slider opposite the bonding balls. This more uniformly distributes the ultrasonic energy before it reaches the bonding balls. This also minimizes the risk of accidental "knocking" of the solder balls by the ultrasonic tip. Also, because the tip is positioned on the crisp, flat side of the slider rather than on the uneven, bumpy side with the solder balls, the distance of the tip from the slider can be more readily measured using optical instruments. An optical instrument, such as charged coupled device camera, can then be used to precisely control the position of the tip with respect to the slider and suspension. This allows the process of reclaiming suspensions to be automated. An automated system can process several HGAs at once while reducing touch labor and increasing recycle yields.

The inventors have found that applying ultrasonic energy on the side of the slider opposite the solder ball has at least two advantages. A first advantage is that, because the side of the slider opposite the solder ball is flat, the slider can transfer ultrasonic energy to four or six solder balls evenly. The solder balls can be removed using the same process parameters. The second advantage is that, because the ultrasonic tip does not directly connect the solder ball, applying ultrasonic energy to the slider results in the separation of the solder balls from the suspension pad at the IMC layer. This leaves a small allowable amount of solder remaining at the suspension pad, which is helpful for re-bonding a new slider onto the reclaimed HGA.

In a first aspect, therefore, the invention is a method for reclaiming a disk drive suspension including providing a head gimbal assembly which includes a slider, disk drive suspension, and bonding ball connecting the suspension to the slider, contacting an ultrasonic probe to a second side of the slider opposite the first side, applying ultrasonic energy from the probe to the second side such that the ultrasonic energy is transmitted through the slider to the first side, weakening the bonding ball with the ultrasonic energy, and separating the slider from the suspension In a second aspect, the invention is a method for reclaiming a disk drive suspension, including providing a head gimbal assembly which includes a slider, disk drive suspension, and bonding ball connecting the suspension to a first side of the slider, contacting an ultrasonic probe, the probe coupled to an ultrasonic generator, to a leading edge of the slider, applying a predetermined frequency and power from the generator such that the probe oscillates in contact with the slider, oscillating the slider using the probe, weakening the adhesive and the solder with the oscillations, and then separating the slider from the suspension.

In a third aspect, the invention is a method for reworking a head gimbal assembly for disk drive applications, including holding a head gimbal assembly comprising a magnetic head slider, the magnetic head slider being physically attached to a portion of the head gimbal assembly, contacting a probe member, coupled to an ultrasonic transducer, to a leading edge of the magnetic head slider, applying a predetermined power from the ultrasonic transducer to the probe member such that the probe member oscillates at a frequency around 28 kHz in a linear motion having a spatial displacement of less than 0.03 millimeters as the probe member is in contact within the leading edge of the magnetic head slider, causing a repetitive pushing action using the oscillation of the probe member to the magnetic head slider while applying the predetermined power from the ultrasonic transducer to the probe member, separating the magnetic head slider from the head gimbal assembly, and removing the predetermined power from the ultrasonic transducer.

Exemplary embodiments of the invention will be further described below with reference to the drawings, in which like numbers refer to like parts.

DETAILED DESCRIPTION OF THE PREFERRED EMBODIMENTS

Figure 1:
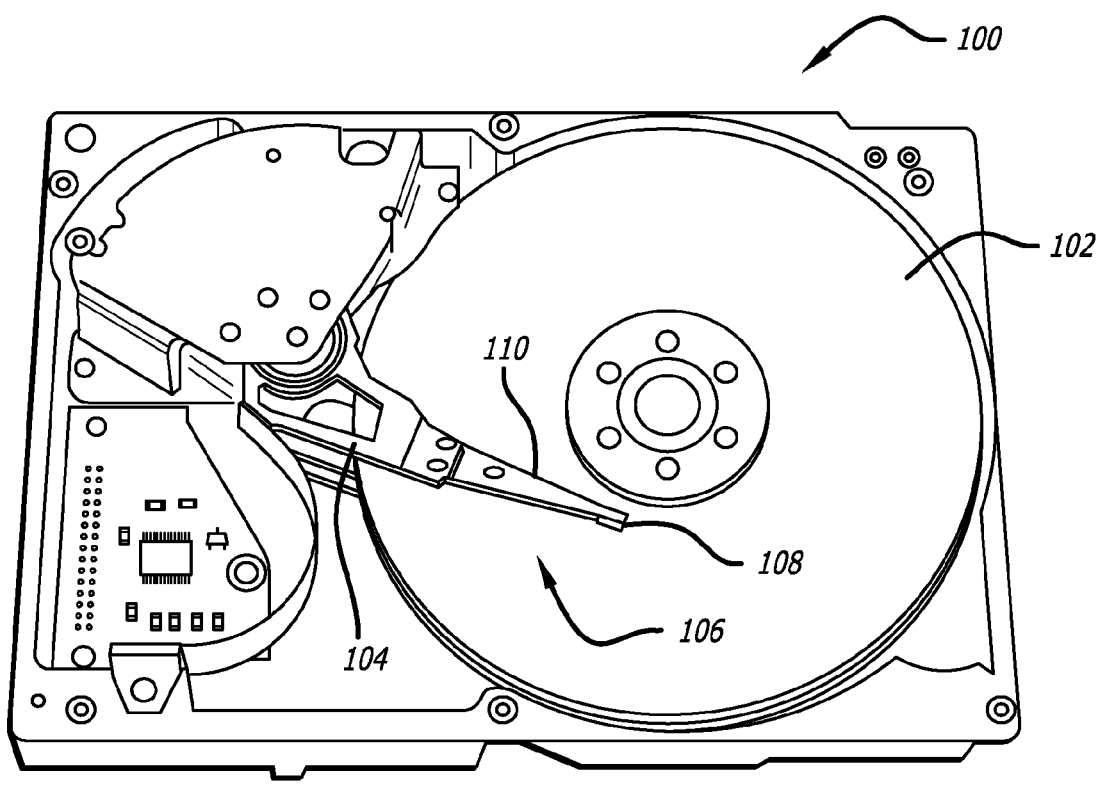
FIG. 1 is a perspective view of a hard disk drive according to an embodiment of the present invention.

With reference to FIG. 1, a typical hard disk drive 100 includes at least one data storage disk 102 (e.g., one, two, three, or more disks), at least one actuator arm 104 (e.g., one, two, three, or more actuator arms), and at least one head gimbal assembly (HGA) 106 (e.g., one, two, three, or more head gimbal assemblies). Each HGA 106 is composed of a slider 108 and a disk drive suspension 110. This diagram, as well as other diagrams provided herein, is merely an example, which should not unduly limit the scope of the claims herein. One of ordinary skill in the art would recognize many other variations, modifications, and alternatives.

Figure 2:
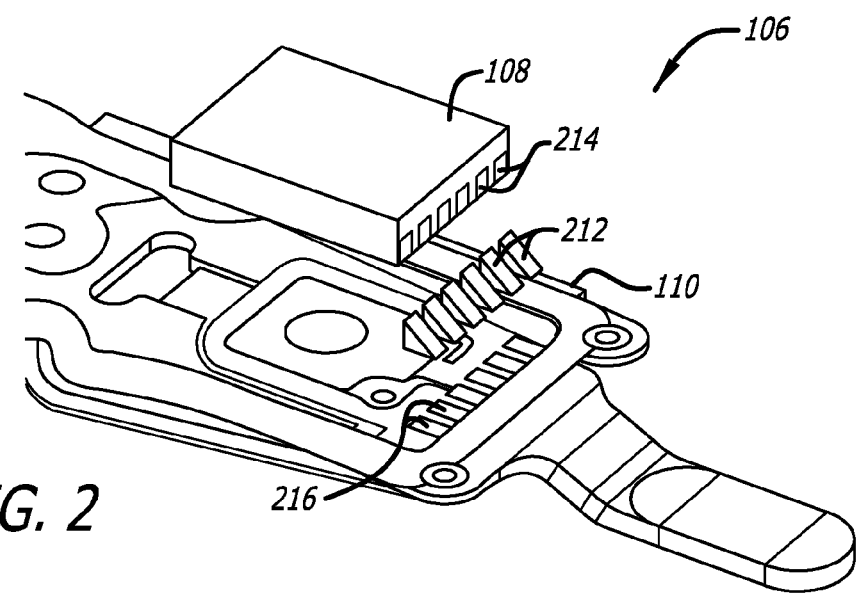
FIG. 2 is a perspective, exploded view of a head gimbal assembly.

With reference to FIG. 2, HGA 106 also has bonding balls 212 which electrically connect electrical contacts 214 on slider 108 to flexure terminal pads 216 on suspension 110. The terminal pads 214 of the slider are sometimes called "slider pads;" the terminal pads 216 of the suspension's flexure are sometimes called "suspension pads."

Figure 3A:
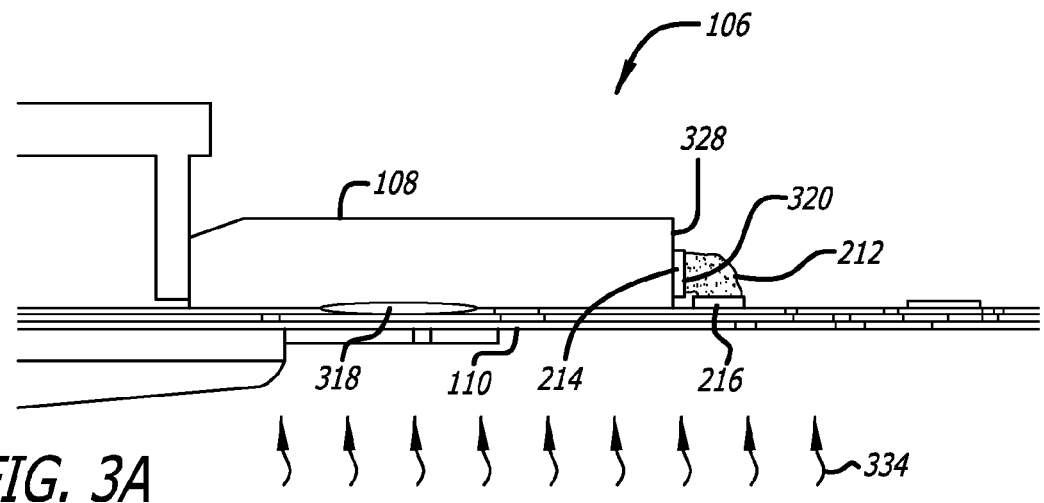
FIGS. 3A-3C are side elevation views of a head gimbal assembly undergoing an ultrasonic reclaim method in accordance with an embodiment of the invention.
Figure 3B:
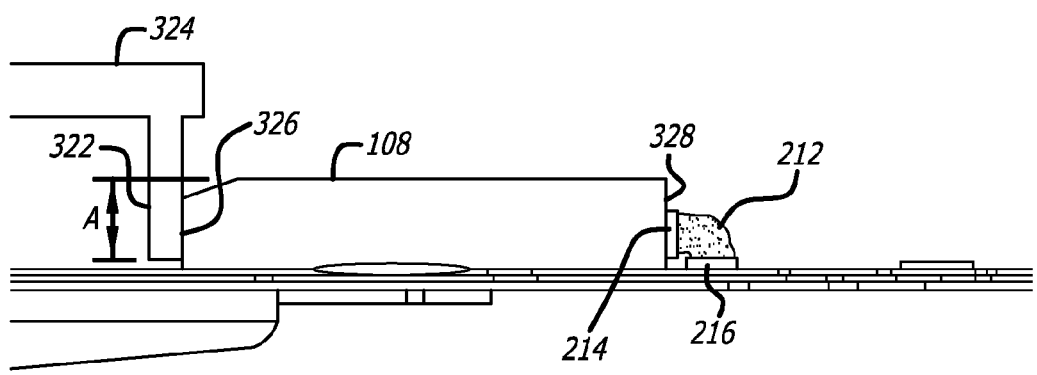
Figure 3C:
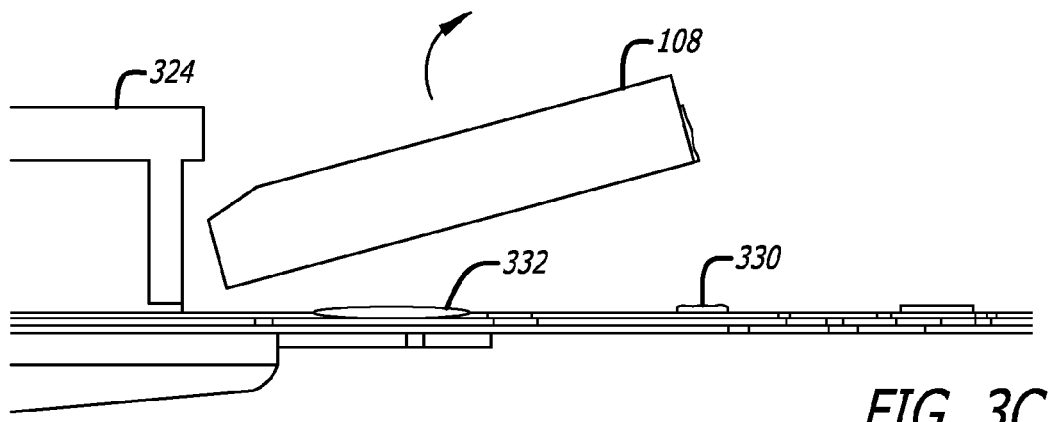

With reference to FIGS. 3A-3C, HGA 106 comprises slider 108 and suspension 110. Slider 108 is electrically connected and mechanically attached to suspension 110 by one or more bonding balls 212. Bonding balls 212 can include gold balls, solder balls, and equivalents. With solder balls, a hard but brittle intermetallic compound (IMC) can coat parts of the surface next to the terminal pads.

In addition to bonding balls 212, an adhesive 318 typically attaches slider 108 to suspension 110. Adhesive 318 is typically an epoxy.

The epoxy and solder balls can be pre-heated in order to soften them. Heating may be accomplished by flowing hot air 334 around the HGA. This facilitates removing the slider and bonding balls and can help avoid unnecessary suspension damage. If the temperature is too low, then not enough solder is removed. If the temperature is too high, then the solder can spread from the suspension pads down the traces. A stable bonding ball temperature of between 180 degrees Celsius (° C.) and 190° C. has been shown to effectively soften the solder balls, with a temperature of 190° C. preferable.

An ultrasonic generator and transducer (not shown) supply ultrasonic energy in the form of oscillations, preferably at about 28 thousand cycles per second (kHz) with a power setting of about 200 watts (W), to ultrasonic horn 324. Ultrasonic horn 324 can change the ultrasonic vibration amplitude and transfer ultrasonic power to ultrasonic tip 322. A spatial displacement of less than 0.03 mm has been shown to be effective in removing sliders. Vibration amplitude is generally defined by power, horn shape, and tip shape. In the exemplary configuration of FIGS. 3A-3C with bonding balls 212 on slider trailing edge 328, it is useful to move the ultrasonic probe tip to contact slider leading edge 326. This edge or side is opposite the side of the slider with bonding balls 212. As long as ultrasonic tip 322 contacts slider leading edge 326, the ultrasonic tip will transfer ultrasonic oscillations to slider 108. The oscillations are preferably longitudinal to the slider. The slider will start to oscillate at a high frequency, which in turn transfers ultrasonic oscillations to attached bonding balls 212.

Preferably, overlap A (see FIG. 3B) between ultrasonic probe tip 326 and the top of slider 108 is about 0.1 millimeter (mm). If overlap A is too small then suspension pads 216 and the flexure can bend.

Preferably, the nominal rate at which the ultrasonic probe tip is advanced toward the slider is about 0.2 mm/second. This speed has been shown to prevent tip 322 from breaking.

Meanwhile, bonding balls 212 can be pre-heated at predefined temperatures of around 180° C.-190° C. using flowing hot air 334. Under these conditions, IMC layer 320 will become mechanically stressed and easily compression-tension fatigued. In a very short time, on the order of microseconds, the solder can break off at the IMC layer and fall off, as shown in FIG. 3B.

Meanwhile, the epoxy which is between slider 108 and the suspension tongue also undergoes mechanical stress, under the same pre-heat air flow, and slider 108 can relatively easily fall off from suspension 110 without damaging the suspension, as shown in FIG. 3C. Ideally, the only trace of the slider having been previously installed is a small amount of IMC residue and adhesive residue, and any cracks in suspension pad 216 are avoided.

The present ultrasonic method uses a high frequency oscillation and centralized power. The oscillations are preferably transferred only onto the slider by the ultrasonic tip. It has been shown that this method easily removes both a slider and solder balls in a very short time.

Further, this method is more easily automated than methods of the prior art. This can save manpower, improve units per hour (UPH), and the yield of reclaimed suspensions.

It will be appreciated that all numerical values herein refer to a range of values within a tolerance commonly used or recognized as functional equivalents by practitioners within the art given the task. It is believed that a tolerance of ±10% would also work well.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A method for reclaiming a disk drive suspension, the method comprising:
providing a head gimbal assembly comprising:
a slider;
a disk drive suspension; and
a bonding ball connecting the suspension to a first side of the slider;
contacting an ultrasonic probe to a second side of the slider opposite the first side;
applying ultrasonic energy from the probe to the second side such that the ultrasonic energy is transmitted through the slider to the first side, thereby weakening the bonding ball with the ultrasonic energy;
flowing hot air around the head gimbal assembly, weakening further the bonding ball with heat from the hot air; and then
separating the slider from the suspension.

2. The method of claim 1 wherein the ultrasonic energy comprises oscillations at about 28 kHz.

3. The method of claim 1 wherein the probe comprises a tip, the tip overlapping a top of the slider by about 0.1 mm.

4. The method of claim 1 wherein the probe is advanced toward the slider at about 0.2 mm/sec.

5. The method of claim 1 wherein the bonding ball is heated to between 180° C. and 190° C. by the hot air.

6. The method of claim 1 wherein the bonding ball comprises a solder ball.

7. The method of claim 1 wherein the bonding ball comprises a gold ball.

8. The method of claim 1 wherein the second side of the slider is a leading edge.

9. A method for reclaiming a disk drive suspension, the method comprising:
providing a head gimbal assembly comprising:
a slider;
a disk drive suspension;
adhesive adhering the slider to the suspension; and
solder electrically connecting the slider and the suspension;
contacting an ultrasonic probe, the probe coupled to an ultrasonic generator, to a leading edge of the slider;
applying a predetermined frequency and power from the generator such that the probe oscillates in contact with the slider;
oscillating the slider using the probe, weakening the adhesive and the solder with the oscillations;

flowing hot air around the head gimbal assembly, weakening further the adhesive and the solder with heat from the hot air; and then separating the slider from the suspension.

10. The method of claim 9 wherein the predetermined frequency and power are about 28 kHz and about 200 watts, respectively.

11. The method of claim 9 wherein the solder balls are heated to between 180° C. and 190° C. by the hot air.

12. The method of claim 9 wherein the adhesive is epoxy.

13. A method for reworking a head gimbal assembly for disk drive applications, the method comprising:

holding a head gimbal assembly comprising a slider, the slider being physically attached to a portion of the head gimbal assembly;

contacting a probe, coupled to an ultrasonic transducer, to a leading edge of the slider;

applying a predetermined power from the ultrasonic transducer to the probe member such that the probe member oscillates at a frequency around 28 kHz as the probe member is in contact with the leading edge of the magnetic head slider;

causing a repetitive pushing action using the oscillation of the probe member to the magnetic head slider while applying the predetermined power from the ultrasonic transducer to the probe member; and separating the magnetic head slider from the head gimbal assembly.

14. The method of claim 13 wherein the probe is advanced toward the slider at about 0.2 mm/sec.

15. The method of claim 13 wherein the probe oscillates at a power of about 200 watts.

* * * * *